United States Patent
Bhatti et al.

(10) Patent No.: US 7,331,378 B2
(45) Date of Patent: Feb. 19, 2008

(54) MICROCHANNEL HEAT SINK

(75) Inventors: Mohinder Singh Bhatti, Amherst, NY (US); Mark Joseph Parisi, East Amherst, NY (US); Andrew R. Hayes, Clarence Center, NY (US)

(73) Assignee: Delphi Technologies, Inc., Troy, MI (US)

( * ) Notice: Subject to any disclaimer, the term of this patent is extended or adjusted under 35 U.S.C. 154(b) by 201 days.

(21) Appl. No.: 11/333,655

(22) Filed: Jan. 17, 2006

(65) Prior Publication Data

US 2007/0163750 A1 Jul. 19, 2007

(51) Int. Cl.
*H05K 7/20* (2006.01)

(52) U.S. Cl. ................. 165/80.4; 257/714; 361/699

(58) Field of Classification Search ............... 165/80.4; 257/714; 361/699
See application file for complete search history.

(56) References Cited

U.S. PATENT DOCUMENTS

| | | | |
|---|---|---|---|
| 4,758,926 A * | 7/1988 | Herrell et al. ............... 361/699 |
| 5,388,635 A | 2/1995 | Gruber ...................... 165/80.4 |
| 5,453,641 A * | 9/1995 | Mundinger et al. ......... 257/714 |
| 6,986,382 B2 * | 1/2006 | Upadhya et al. ............ 165/80.4 |
| 6,988,534 B2 * | 1/2006 | Kenny et al. ............... 165/80.4 |
| 7,032,651 B2 * | 4/2006 | Winslow et al. ........... 165/80.4 |
| 7,104,312 B2 * | 9/2006 | Goodson et al. ........... 165/80.4 |
| 2004/0188066 A1 * | 9/2004 | Upadhya et al. ........... 165/80.4 |
| 2006/0096738 A1 * | 5/2006 | Kang et al. ................ 165/80.4 |
| 2006/0108098 A1 * | 5/2006 | Stevanovic et al. ........ 165/80.4 |

* cited by examiner

*Primary Examiner*—Leonard R Leo
(74) *Attorney, Agent, or Firm*—Patrick M. Griffin

(57) ABSTRACT

The invention provides a heat sink for flowing coolant into inlet manifold channels extending into a inlet edge of a manifold where the flow is forced downward into parallel and spaced micro-channels extending across the manifold channels and re-directing the coolant up into and out of outlet manifold channels extending into an outlet edge of the manifold and interleaved with the inlet manifold channels, and by maintaining a base-width of the micro-channels in the range of forty microns to one hundred microns, maintaining a base-height of the micro-channels in the range of two hundred microns to four hundred microns, maintaining a manifold-height through of the manifold channels in the range of one thousand microns to three thousand microns, and maintaining a manifold-width of the manifold channels in the range of three hundred and fifty microns to one thousand microns.

4 Claims, 3 Drawing Sheets

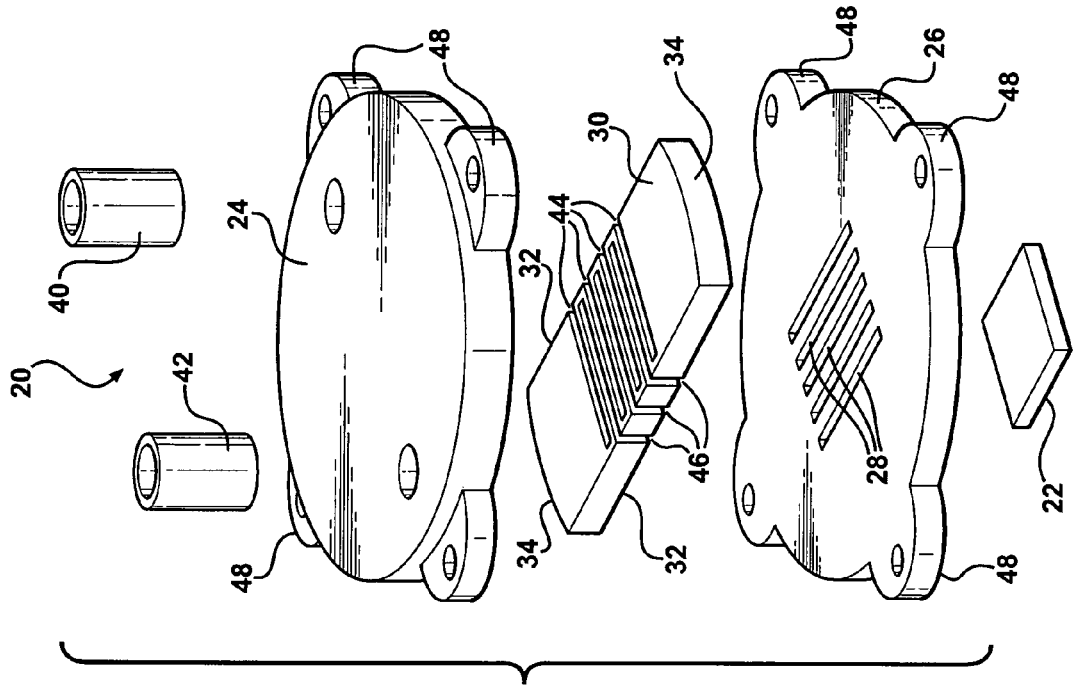
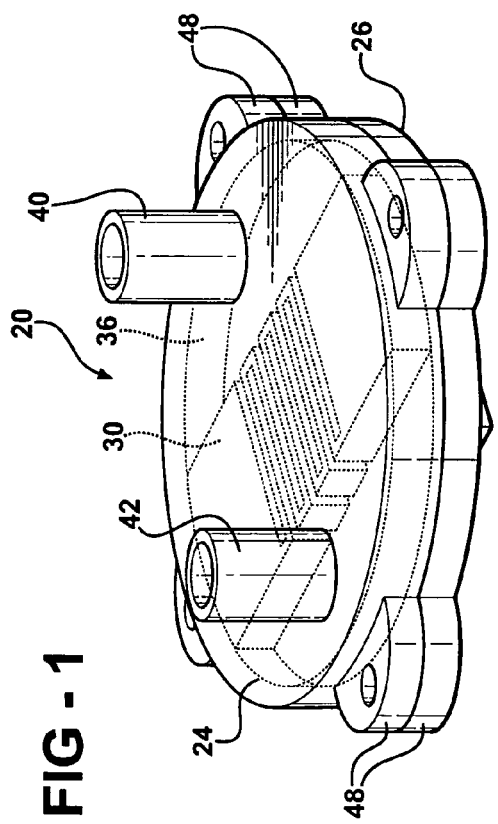
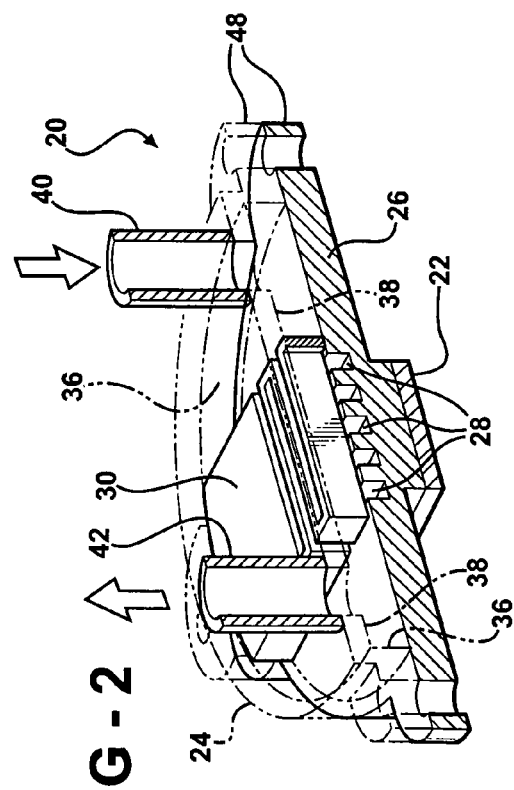

MICROCHANNEL HEAT SINK

BACKGROUND OF THE INVENTION

1. Field of the Invention

The subject invention provides heat sink for transferring heat from a heat source to a coolant fluid and a method of operation.

2. Description of the Prior Art

Electrical components, such as integrated circuits, generate heat that must be dissipated or cooled because heat negatively impacts electrical components. Heat sinks have been employed to dissipate heat and include successive tiers of overlapping channels above a cold plate or base against which the electronic heat component is disposed. Such a heat sink is disclosed in U.S. Pat. No. 5,388,635 to Gruber et al. Typically a flat cold plate or base presents parallel passages or channels all extending the same distance in the cold plate and a manifold plate overlies the cold plate. The electronic component is mounted on the opposite face of the cold plate and coolant flow through the passages to extract heat from the electronic component.

It is a constant goal to fabricate a heat sink which minimizes cost of fabrication yet maximizes the capacity to extract heat, minimizes heat sink mass while maximizing capacity to extract heat.

SUMMARY OF THE INVENTION AND ADVANTAGES

The present invention provides a heat sink and method of transferring heat from a heat source to a coolant fluid by flowing coolant into inlet manifold channels extending into a inlet edge of a manifold where the flow is forced downward into parallel and spaced micro-channels extending across the manifold channels and re-directing the coolant up into and out of outlet manifold channels extending into an outlet edge of the manifold and interleaved with the inlet manifold channels. The increased efficiency is obtained by maintaining a base-width of the micro-channels in the range of forty (40) microns to one hundred (100) microns, maintaining a base-height of micro-channels in the range of two hundred (200) microns to four hundred (400) microns, maintaining a manifold-height through the manifold channels in the range of one thousand (1000) microns to three thousand (3000) microns, and maintaining a manifold-width of the manifold channels in the range of three hundred and fifty (350) microns to one thousand (1000) microns.

Accordingly, the subject invention provides a heat sink that maximizes heat transfer by optimizing the operational relationships of the parameters that affect coolant flow and heat transfer.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 1 is an assembled view showing the lid in phantom of a preferred embodiment of the heat sink of the subject invention;

FIG. 2 is a perspective view, partially cut away and in cross section;

FIG. 3 is an exploded view;

DETAILED DESCRIPTION OF THE INVENTION

Figure 4:
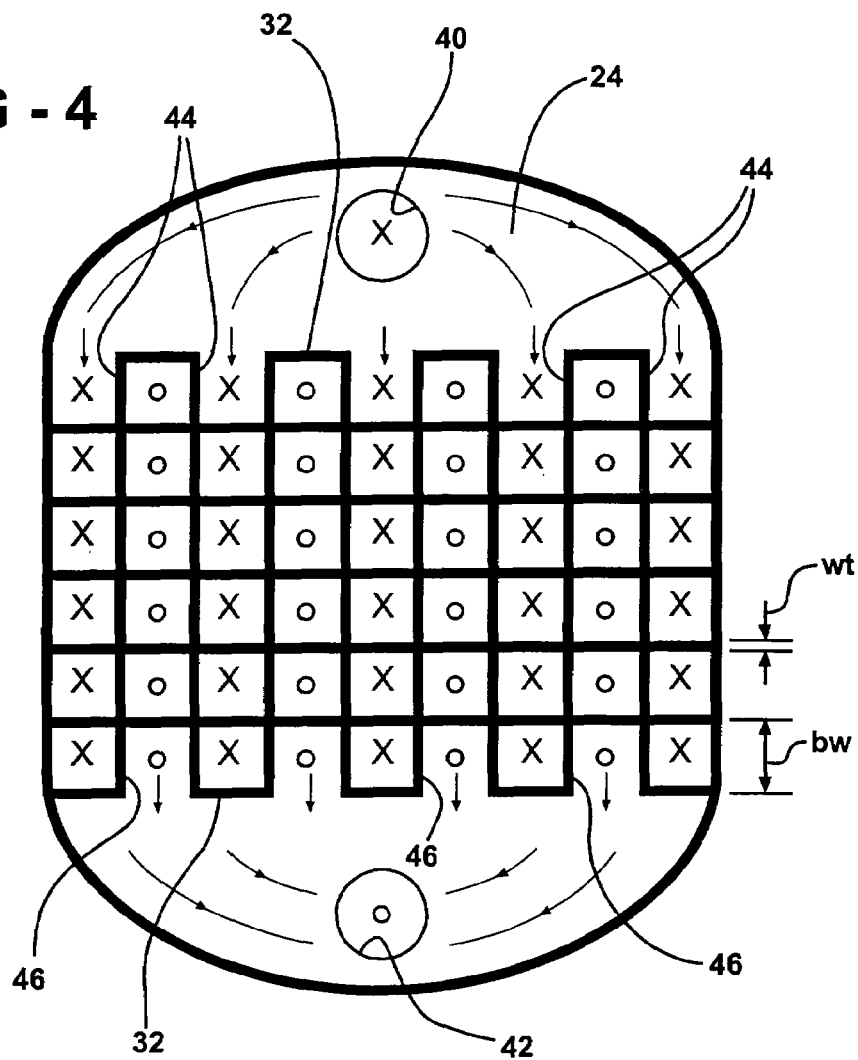
FIG. 4 is a schematic plan view illustrating the relationship between the various flow channels.

Referring to the Figures, wherein like numerals indicate corresponding parts throughout the several views, a heat sink 20 is shown generally for transferring heat from a heat source 22 or electronic component to a coolant fluid.

The heat sink 20 is defined by a housing including a lid 24 and a base 26, the base 26 being a flat cold plate having a top surface and a bottom surface and parallel micro-channels 28 all extending the same distance and each having a base-width bw and a base-height bh into the top surface of the base.

A manifold plate 30, having a top face and a bottom face to define a manifold-thickness mt, is disposed with the bottom face overlying the micro-channels 28 and having spaced edges 32 extending between opposite ends 34. The lid 24 has a periphery engaging the base and an interior shoulder 36 engaging the ends 34 of the manifold plate 30 to define a recessed surface 38 within the periphery and in engagement with the top face of the manifold plate 30. The edges 32 of the manifold plate 30 define an inlet edge 32 (on the right side of the Figures) and an outlet edge 32 (on the left side of the Figures) each spaced from the shoulder 36 to define an inlet plenum between the inlet edge 32 and the shoulder 36 and an outlet plenum between the outlet edge 32 and the shoulder 36. An inlet conduit 40 extends into the lid 24 for fluid flow into the inlet plenum and an outlet conduit 42 extends into the lid 24 for fluid flow out of the outlet plenum.

The manifold plate 30 presents inlet manifold channels 44 extending into the inlet edge 32 and outlet manifold channels 46 extending into the outlet edge 32 with each manifold channel terminating in spaced relationship to the opposite edge 32. The inlet manifold channels 44 alternate with the outlet manifold channels 46 to define rectangular cells with X indicating flow into the channels 44, 46 and 0 indicating flow out of the channels 44, 46 as shown in FIG. 4. As a result of this flow arrangement, the pressure drop is low because the flow contracts as the flow enters the micro-channels 28 and expands as the flow reverses and flows out of the micro-channels 28. A wall-thickness wt is defined or exists between the manifold channels 44, 46 with the inlet manifold channels 44 interleaved with the outlet manifold channels 46 from the outlet edge 32. The manifold channels 44, 46 have a manifold-width mw and a manifold-height nih equal to the manifold-thickness mt.

The lid 24 and the base are circular in exterior configuration and include ears 48 extending radially for mating engagement and defining bolt holes to receive bolts for sealing the lid 24 to the base with the manifold sandwiched therebetween. Appropriate gaskets are sandwiched between the mating parts.

Figure 5:
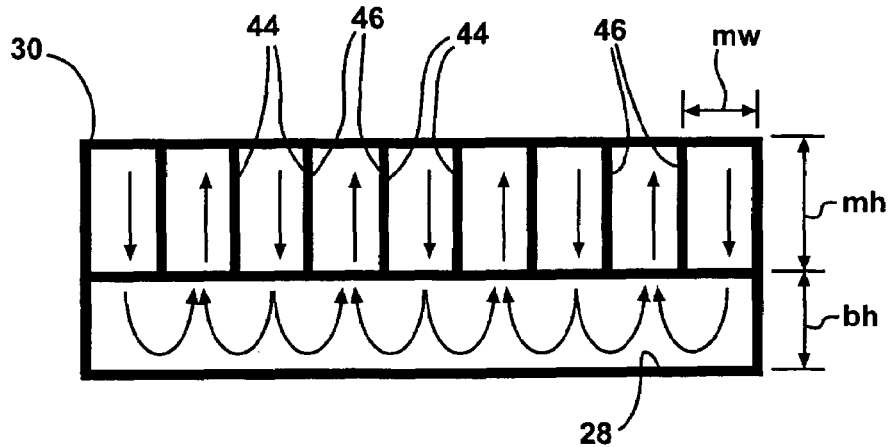
FIG. 5 is a schematic cross sectional view illustrating the relationship between the various flow channels.

As will be appreciated, the manifold channels 44, 46 extend transversely across the micro-channels 28 in the base whereby coolant flows from the inlet conduit 40 and into the inlet plenum and into the inlet manifold channels 44 where the flow is forced downward into the micro-channels 28 where the coolant is re-directed up into the outlet manifold channels 46 and out into the outlet plenum for exit out of the outlet conduit 42 to convey heat from a heat source 22 engaging the exterior of the base, as shown in FIGS. 4 and 5. In order to obtain the maximum operating efficiency, the a base-width bw of the micro-channels 28 is maintained in the range of forty (40) microns to one hundred (100) microns, the base-height bh into the base of the micro-channels 28 in the range of two hundred (200) microns to four hundred (400) microns, the manifold-height through the manifold-thickness of the manifold channels 44, 46 in the range of one thousand (1000) microns to three thousand (3000) microns, and the manifold-width mw of the manifold channels 44, 46 in the range of three hundred and fifty (350) microns to one thousand (1000) microns. Additionally, the micro-channel 28 wall-thickness is fifty (50) microns. In further perfection, the heat presenting area of the heat source 22 has a ratio to the active heat transfer area of the bottom surface of the base covered by the micro-channels 28 between seven tenths (0.7) and one (1).

The invention, therefore, provides a method of transferring heat from a heat source 22 to a coolant fluid by flowing coolant into inlet manifold channels 44 extending into a inlet edge 32 of a manifold where the flow is forced downward (indicated by X in FIG. 4) into parallel and spaced micro-channels 28 extending across the manifold channels 44, 46 and re-directing the coolant up (indicated by the O in FIG. 4) into and out of outlet manifold channels 46 extending into an outlet edge 32 of the manifold and interleaved with the inlet manifold channels 44, and by maintaining a base-width bw of the micro-channels 28 in the range of forty (40) microns to one hundred (100) microns, maintaining a base-height bh of the micro-channels 28 in the range of two hundred (200) microns to four hundred (400) microns, maintaining a manifold-height mh through of the manifold channels 44, 46 in the range of one thousand (1000) microns to three thousand (3000) microns, and maintaining a manifold-width mw of the manifold channels 44, 46 in the range of three hundred and fifty (350) microns to one thousand (1000) microns.

The method is further distinguished by maintaining a flow rate of coolant through the manifold channels 44, 46 and micro-channels 28 between two tenths (0.2) and three tenths (0.3) gallons per minute (GPM).

Figure 6:
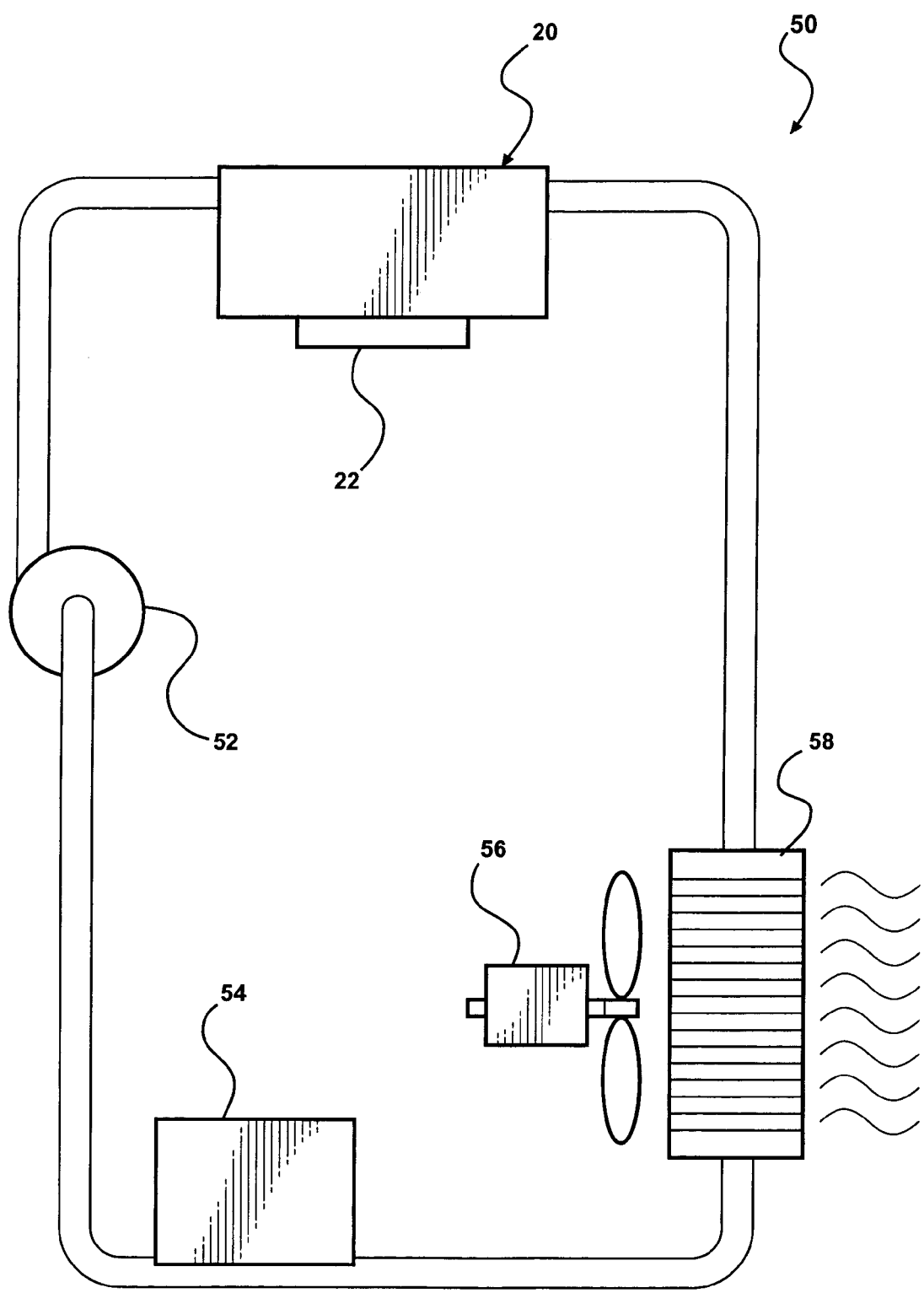
FIG. 6 is a schematic view of a system for moving coolant through the heat sink of the subject invention.

Referring to FIG. 6, the operation of the heat sink 20 is incorporated into a liquid cooling system 50 generally shown. A working fluid mover, such as a pump 52, moves the flow of cooling fluid, usually a liquid, through a cooling fluid storage tank 54, which stores excess cooling fluid. The pump 52 moves the cooling fluid through a heat exchanger to dissipate heat from the cooling fluid. The heat exchanger includes a fan 56 and a radiator 58. The radiator 58 can be of the well known type including tubes with cooling fins between the tubes to exchange heat between the cooling fluid passing through the tubes and air forced through the radiator 58 by the fan 56.

Obviously, many modifications and variations of the present invention are possible in light of the above teachings. The invention may be practiced otherwise than as specifically described within the scope of the appended claims.

What is claimed is:

1. A heat sink for transferring heat from a heat source to a coolant fluid comprising;

a housing including a flat base defining a cold plate having parallel micro-channels all extending the same distance and each having a base-width and a base-height into said cold plate, a manifold plate having a top face and a bottom face to define a manifold-thickness with said bottom face overlying said micro-channels and having spaced edges extending between opposite ends, said housing presenting a interior shoulder engaging said ends of said manifold plate to define a recessed surface in engagement with said top face of said manifold plate, said edges of said manifold plate defining an inlet edge and an outlet edge each spaced from said shoulder to define an inlet plenum between said inlet edge and said shoulder and an outlet plenum between said outlet edge and said shoulder, said manifold plate presenting inlet manifold channels extending into said inlet edge and outlet manifold channels extending into said outlet edge with each manifold channel terminating in spaced relationship to the opposite edge, said inlet manifold channels alternating with said outlet manifold channels to define a wall-thickness of the underlying micro-channel so that manifold channels from said inlet edge are interleaved with manifold channels from said outlet edge with said manifold channels having a manifold-width and a manifold-height equal to said manifold-thickness, said manifold channels extending transversely across said micro-channels in said base whereby coolant flows from said inlet conduit and into said inlet plenum and into said inlet manifold channels where the flow is forced downward into said micro-channels where the coolant is re-directed up into said outlet manifold channels and out into said outlet plenum for exit out of said outlet conduit to convey heat from a heat source engaging the exterior of said base, said base-width of said micro-channels being in the range of forty (40) microns to one hundred (100) microns, said base-height into said base of said micro-channels being in the range of two hundred (200) microns to four hundred (400) microns, said manifold-height through said manifold-thickness of said manifold channels being in the range of one thousand (1000) microns to three thousand (3000) microns, and said manifold-width of said manifold channels in the range of three hundred and fifty (350) microns to one thousand (1000) microns.

2. A heat sink as set forth in claim 1 wherein said heat source presents an area having a ratio to the area of said bottom surface of said base between seven tenths (0.7) and one (1).

3. A heat sink as set forth in claim 1 wherein said wall-thickness is fifty (50) microns.

4. A heat sink for transferring heat from a heat source to a coolant fluid comprising;

a housing including a lid and a base, said base being a flat cold plate having a top surface and a bottom surface and parallel micro-channels all extending the same distance and each having a base-width and a base-height into said top surface of said base, a manifold plate having a top face and a bottom face to define a manifold-thickness with said bottom face overlying said micro-channels and having spaced edges extending between opposite ends, said lid having a periphery engaging said base and a interior shoulder engaging said ends of said manifold plate to define a recessed surface within said periphery and in engagement with said top face of said manifold plate, said edges of said manifold plate defining an inlet edge and an outlet edge each spaced from said shoulder to define an inlet plenum between said inlet edge and said shoulder and an outlet plenum between said outlet edge and said shoulder, an inlet conduit in said lid for fluid flow into said inlet plenum, an outlet conduit in said lid for fluid flow out of said outlet plenum, said manifold plate presenting inlet manifold channels extending into said inlet edge and outlet manifold channels extending into said outlet edge with each manifold channel terminating in spaced relationship to the opposite edge, said inlet manifold channels alternating with said outlet manifold channels to define a wall-thickness therebetween so that manifold channels from said inlet edge are interleaved with manifold channels from said outlet edge with said manifold channels having a manifold-width and a manifold-height equal to said manifold-thickness, said lid and said base being circular and including ears extending radially for mating engagement and defining bolt holes for sealing said lid to said base with said manifold plate sandwiched therebetween, a heat source having a heat presenting area in contact with said bottom surface of said base, said manifold channels extending transversely across said micro-channels in said base whereby coolant flows from said inlet conduit and into said inlet plenum and into said inlet manifold channels where the flow is forced downward into said micro-channels where the coolant is re-directed up into said outlet manifold channels and out into said outlet plenum for exit out of said outlet conduit to convey heat from a heat source engaging the exterior of said base, said base-width of said micro-channels being in the range of forty (40) microns to one hundred (100) microns, said base-height into said base of said micro-channels being in the range of two hundred (200) microns to four hundred (400) microns, said manifold-height through said manifold-thickness of said manifold channels being in the range of one thousand (1000) microns to three thousand (3000) microns, and said manifold-width of said manifold channels in the range of three hundred and fifty (350) microns to one thousand (1000) microns, said wall-thickness being fifty (50) microns, and said heat presenting area of said heat source having a ratio to the active heat transfer area of the bottom surface of the base covered by the micro-channels between seven tenths and one.

\* \* \* \* \*